(12) United States Patent
Teng

(10) Patent No.: US 12,706,614 B2
(45) Date of Patent: Aug. 11, 2026

(54) DECODER CIRCUIT AND DECODING METHOD CAPABLE OF REDUCING NUMBER OF READ/WRITE OF MEMORY TO REDUCE POWER CONSUMPTION

(71) Applicant: Silicon Motion, Inc., Hsinchu County (TW)

(72) Inventor: Duen-Yih Teng, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 117 days.

(21) Appl. No.: 18/919,356

(22) Filed: Oct. 17, 2024

(65) Prior Publication Data

US 2026/0113058 A1 Apr. 23, 2026

(30) Foreign Application Priority Data

Mar. 7, 2024 (TW) ................................ 113108274

(51) Int. Cl.
*H03M 13/11* (2006.01)
*G06F 3/06* (2006.01)

(52) U.S. Cl.
CPC ....... *H03M 13/1111* (2013.01); *G06F 3/0679* (2013.01)

(58) Field of Classification Search
CPC ................................................ H03M 13/1111
See application file for complete search history.

(56) References Cited

U.S. PATENT DOCUMENTS 8,161,345 B2 * 4/2012 Graef ................ H03M 13/1111 714/752
8,291,292 B1 * 10/2012 Varnica ................ G06F 11/073 714/758
8,578,256 B2 * 11/2013 Graef ................... H04L 1/0051 714/801
2010/0042902 A1 * 2/2010 Gunnam ........... H03M 13/1142 708/207

(Continued)

FOREIGN PATENT DOCUMENTS

EP 1 198 892 B1 9/2008
WO 2021/048559 A1 3/2021
WO 2023/272739 A1 1/2023

*Primary Examiner* — Joseph D Torres
(74) *Attorney, Agent, or Firm* — Winston Hsu

(57) ABSTRACT

A decoding method includes: providing channel value memory to store input data as a channel value; providing sign memory to store a sign value; providing gradient descent bit memory to store differential information of a channel value; providing variable node unit to generate a first output value and a second output value according to the channel value; converting first output value into a converted first output value from variable node domain into check node domain; providing check node unit to generate check-to-variable message according to the converted first output value or the sign value stored in the sign memory; converting the check-to-variable message into a converted check-to-variable message from check node domain into variable node domain and transmitting the converted check-to-variable message into the variable node domain; and, deciding output data according to channel value and differential information stored in gradient descent bit memory.

17 Claims, 3 Drawing Sheets

(56) References Cited

U.S. PATENT DOCUMENTS

| | | | | |
|---|---|---|---|---|
| 2010/0131819 | A1* | 5/2010 | Graef | H03M 13/1137<br>714/752 |
| 2010/0251059 | A1* | 9/2010 | Dielissen | H03M 13/1168<br>714/752 |
| 2013/0212447 | A1* | 8/2013 | Li | H03M 13/1122<br>714/763 |
| 2013/0275827 | A1* | 10/2013 | Wang | G06F 11/1076<br>714/752 |
| 2014/0089757 | A1* | 3/2014 | Yang | H03M 13/116<br>714/752 |
| 2017/0149446 | A1* | 5/2017 | Tao | H03M 13/1142 |
| 2018/0062666 | A1* | 3/2018 | Zhang | H03M 13/1122 |
| 2019/0044537 | A1* | 2/2019 | Reynwar | H03M 13/118 |
| 2020/0280374 | A1 | 9/2020 | Tong | |
| 2021/0391872 | A1* | 12/2021 | Declercq | H03M 13/1108 |
| 2025/0284588 | A1* | 9/2025 | Teng | G06F 11/1048 |

* cited by examiner

DECODER CIRCUIT AND DECODING METHOD CAPABLE OF REDUCING NUMBER OF READ/WRITE OF MEMORY TO REDUCE POWER CONSUMPTION

BACKGROUND OF THE INVENTION

1. Field of the Invention

The present invention relates to a decoding scheme, and more particularly to a decoder circuit and a decoding method used in the decoder circuit.

2. Description of the Prior Art

Generally speaking, a circuit element such as a conventional variable node unit in a conventional decoder circuit needs to read/write bit information stored in one or more specific memories each time when it performs a corresponding sum calculation/operation. In the current scheme, the number of bits of bit information in the one or more specific memories is too large, which results in excessive power consumption when the conventional decoder circuit performs hardware calculations.

SUMMARY OF THE INVENTION

Therefore one of the objectives of the present invention is to provide a decoder circuit and decoding method with a novel algorithm mechanism, to solve the above-mentioned problems.

According to embodiments of the present invention, a decoder circuit is disclosed. The decoder circuit comprises a channel value memory, a sign memory, a gradient descent bit memory, a variable node unit, a first barrel shifter, a check node unit, a second barrel shifter, and a decision bit output unit. The channel value memory is used for receiving and storing an input data as a channel value, and the channel value is stored in the channel value memory in a form of a sign bit with multiple magnitude bits. The sign memory is used for storing a sign value. The gradient descent bit memory is used for storing difference information corresponding to the channel value. The variable node unit, coupled to the channel value memory, the sign memory, and the gradient descent bit memory, is used for generating a first output value and a second output value according to the channel value. The first barrel shifter, coupled to the variable node unit, is used for converting the first output value from a variable node domain to a check node domain to generate a converted first output value. The check node unit, coupled to the first barrel shifter, is used for generating a check-to-variable message based on the converted first output value or the sign value stored in the sign memory. The second barrel shifter, coupled to the check node unit, is used for converting the check-to-variable message from the check node domain to the variable node domain to generate a converted check-to-variable message to the variable node unit. The decision bit output unit, coupled to the gradient descent bit memory and the channel value memory, is used for generating and determining an output data according to the channel value in the channel value memory and the difference information corresponding to the channel value stored in the gradient descent bit memory.

According to the embodiments, a decoding method of a decoder circuit is disclosed. The decoding method comprises: providing a channel value memory to receive and store an input data as a channel value, the channel value being stored in the channel value memory in a form of a sign bit with multiple magnitude bits; providing a sign memory to store a sign value; providing a gradient descent bit memory to store a difference information corresponding to the channel value; providing a variable node unit to generate a first output value and a second output value according to the channel value; providing a first barrel shifter to convert the first output value from a variable node domain to a check node domain to generate a converted first output value; providing a check node unit to generate a check-to-variable message based on the converted first output value or the sign value stored in the sign memory; providing a second barrel shifter to convert the check-to-variable message from the check node domain to the variable node domain to generate a converted check-to-variable message to the variable node unit; and, generating and determining an output data according to the channel value in the channel value memory and the difference information corresponding to the channel value stored in the gradient descent bit memory.

These and other objectives of the present invention will no doubt become obvious to those of ordinary skill in the art after reading the following detailed description of the preferred embodiment that is illustrated in the various figures and drawings.

DETAILED DESCRIPTION

The present invention aims at providing a decoding method and decoder circuit capable of reducing the power consumption by providing a novel algorithm scheme to reduce the number of read/write for at least one memory to reduce power consumption when the decoder circuit reads/writes a memory (or register). The decoding method and decoder provided by the present invention can be applied to all kinds of application specific integrated circuit (ASIC) products and all kinds of field programmable gate array (FPGA) products.

Figure 1:
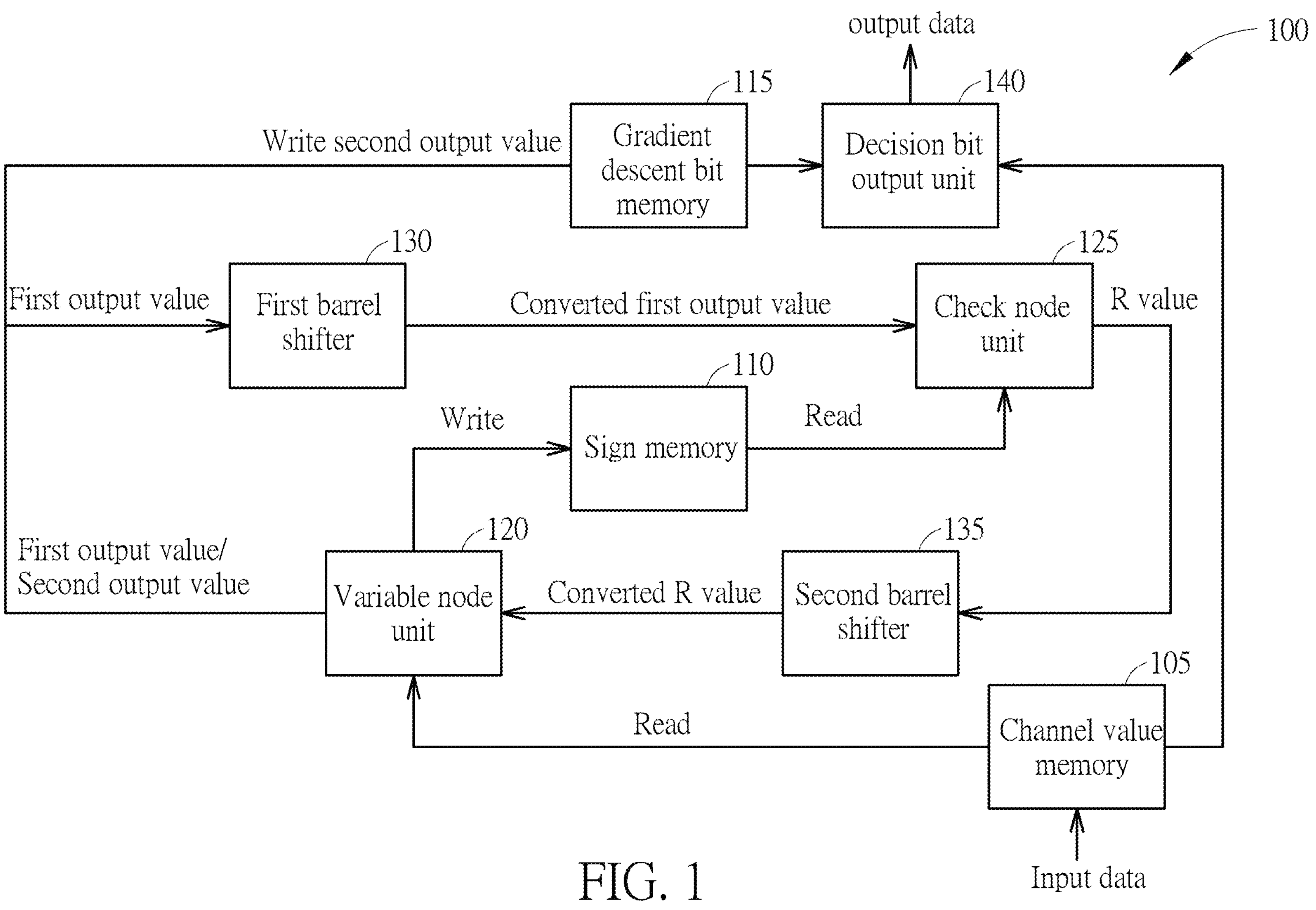
FIG. 1 is a schematic diagram of a decoder circuit in a flash memory controller according to an embodiment of the present invention.

Please refer to FIG. 1. FIG. 1 is a schematic diagram of a decoder circuit 100 in a flash memory controller according to an embodiment of the present invention. The decoder circuit 100 includes a channel value memory 105, a sign memory 110 such as a q sign memory, a gradient descent bit memory 115, a variable node unit (VNU) 120, a check node unit (CNU) 125, a first barrel shifter 130, a second barrel shifter 135, and a decision bit output unit 140. The variable node unit 120, the check node unit 125, and the decision bit output unit 140 may be implemented by hardware circuits or firmware circuits.

Specifically, the value of an input data initially received by the decoder circuit 100 is stored in the channel value memory 105. In one embodiment, the decoder circuit 100 is for example applied to a storage device, so the value of the received input data for example is data read out from one or more flash memories of the storage device. If the decoder circuit 100 is applied to a communication system, then the value of the received input data is for example the data received from a mobile communication device such as a mobile phone. In addition, the channel value memory 105 can receive and store the value of the input data in the form of a codeword. Then, the variable node unit 120 reads the input data (i.e. the stored codeword) from the channel value memory 105.

It should be noted that in the following paragraphs, the wording 'channel value' is used to represent a value received by the decoder circuit 100 and stored into the channel value memory 105. In addition, when the decoder circuit 100 is for example applied to a storage device having one or more flash memories, a sensing read operation is performed upon the potential of a specific bit of a codeword stored in the flash memory to use a reference voltage level to read the potential of the specific bit to generate a sign bit and multiple magnitude bits which can indicate the potential of the specific bit. The sign bit is used to indicate at which side of the reference voltage level the potential of the specific bit is located, and the multiple bits are used to indicate an absolute value of the difference between the potential of the specific bit and the reference voltage level. The more multiple bits are used, the more accurate results of sensing read operation can be achieved. Therefore, in this embodiment, in practice, a channel value stored in the channel value memory 105 refers to the sign bit and the multiple magnitude bits. Similarly, when the decoder circuit 100 is applied to a communication system, for example, a channel value may include a value transmitted by the transmission medium/channel in the communication system and may also be stored in the channel value memory 105 by using a sign bit and multiple magnitude bits.

In one embodiment, the decoder circuit 100 is a low-density parity-check code (LDPC code) decoder circuit and performs an LDPC decoding operation based on a standard column-layered min-sum algorithm. The variable node unit 120 is used to perform a sum operation/calculation of a vertical step in the LDPC decoding operation, and the check node unit 125 is used to perform a minimization calculation of a horizontal step in the LDPC decoding operation.

The following briefly describes the concept of column-layered min-sum algorithm. An input data is a binary LDPC codeword indicated by C. The corresponding parity check matrix has M rows and N columns and can be represented by H. Each row of the corresponding parity check matrix H is associated with a corresponding check node, and each column of the corresponding parity check matrix H corresponds to a variable node. $N(c)=\{v:H_{cv}=1\}$ is used to indicate a set of variable nodes which participate in the calculation of a check node c. $M(v)=\{c:H_{cv}=1\}$ is used to indicate a set of check nodes which participate in the calculation of a variable node v. $I_v$ is the intrinsic message of a variable node v. $R_{cv}$ is a check-to-variable message converted from a check node c to a variable node v, and for example can be also called as an R value (R message). $L_{cv}$ is a variable-to-check message converted from a variable node v to a check node c, and can be also called as a Q value (Q message). A codeword having N bits is divided into G groups having the same size. The G groups are represented by $N_0, N_0, \ldots, N_{G-1}$, and for example the corresponding parity check matrix H is also divided into G block columns having the same size. The iterative decoding concept of the column-layered min-sum algorithm can be described using the following equation. First, at the initial time:

$$L_{cv} = I_v \text{ for } v = 0, 1, \ldots, N-1, c = 0, 1, \ldots, M-1;$$

Then, during the iterative decoding process from the first iteration (i.e. iteration for the first time) to the maximum iteration number, for each in the G groups, i.e. the group $N_g$ and g=0.1, . . . . G−1, in the horizontal step, for each check node c connected to the variable node v belonging to a specific group $N_g$, the calculation of R value $R_{cv}$ can be expressed by the following equation:

$$R_{cv} = \Pi_{n\in N(c)\backslash v}\operatorname{sgn}(L_{cn})\times \min_{n\in N(c)\backslash v}|L_{cn}|;$$

in addition, in the vertical step, for each variable node v belonging to the specific group $N_g$, the calculation and update of the Q value $L_{cv}$ and value $L_v$ are expressed by the following equations:

$$L_{cv} = I_v + \alpha\times\sum\nolimits_{m\in M(v)\backslash c} R_{mv}$$

$$L_v = I_v + \alpha\times\sum\nolimits_{m\in M(v)} R_{mv}$$

in the iterative decoding process of the column-layer min-sum algorithm, the positive/negative sign of the $L_v$ value is used to perform a hard decision to determine the information ('0' or '1') of the specific bit. When a valid codeword is found, the above iterative decoding operation can be interrupted and the decoding operation is completed.

In practice, in order to reduce the power consumption of memory storage and access when performing the above iterative decoding operation, the embodiments of the present invention can adjust and control the operation of variable node unit 120 based on the concept of the above column-layer min-sum algorithm to reduce the read/write requirements of the variable node unit 120 for one or more memories, thereby achieving the purpose of reducing power consumption.

When performing an iterative decoding operation upon the sensed information of the specific bit (i.e. a channel value) for the first time, the variable node unit 120 reads a sign bit and multiple magnitude bits, corresponding to the channel value, from the channel value memory 105. During other subsequent iterative decoding operations of the same decoding operation, the variable node unit 120 does not read the sign bit from the channel value memory 105, and merely reads the multiple magnitude bits from the channel value memory 105 to reduce the number of read/write operations of the channel value memory 105. Therefore, in each subsequent iteration, this can reduce the reading of one bit. In addition, for the reading/writing of the q sign memory 110, when performing the iterative decoding operation for the first time, the variable node unit 120 does not perform a write operation upon the q sign memory 110. During the subsequent decoding operations, only when a change occurs in a first output value, which is processed, calculated, and updated by the variable node unit 120, a sign value of the first output value including the change is written and stored in the q sign memory 110 to replace and update the sign value which stored previously. A sign value, for example, uses the information of one bit ('1' or '0') to represent the positive or negative value of the sign value. In addition, for the reading/writing of the gradient descent bit memory 115, when performing the iterative decoding operation for the first time, the variable node unit 120 does not perform the write operation upon the gradient descent bit memory 115. In subsequent other iterative decoding operations, only when a change occurs in a second output value, which is processed, calculated, and updated by the variable node unit 120, a sign value of the changed second output value is written to the gradient descent bit memory 115.

It should be noted that, compared to a conventional variable node unit in traditional decoding technology for updating and generating the Q value into a conventional barrel shifter and for updating and storing the $L_v$ value into a memory to perform a hard decision to determine bit information, the variable node unit 120 in the embodiments of the present invention is used to update and generate a first output value to replace the output of the Q value and update and generate a second output value to replace the output of the sign value of $L_v$ value, so as to reduce the number of read/write times for memory(s).

The process of the iterative decoding operation performed for multiple times is briefly described below. Initially, during the iterative decoding operation for the first time, the variable node unit 120 reads a channel value ch_v from the channel value memory 105. In this example, the variable node unit 120 reads a sign bit and multiple magnitude bits corresponding to the channel value ch_v from the channel value memory 105. Then, the variable node unit 120 uses the channel value ch_v as the first output value and uses the channel value ch_v as the second output value. In this situation, the first output value (that is, the channel value ch_v) is read by the first barrel shifter 130 as the input of the first barrel shifter 130, and the second output value (that is, the channel value ch_v) at this time will not be written by the variable node unit 120 into the gradient descent bit memory 115. Then, the first barrel shifter 130 is used to convert the first output value from the variable node domain to the check node domain to generate a converted first output value. Then, since in the iterative decoding operation performed for the first time the variable node unit 120 does not write a sign value of the first output value into the q sign memory 110, it is not needed for the check node unit 125 to read the sign value of the q sign memory 110, and the check node unit 125 merely needs to use the calculation algorithm/equation of the above-mentioned R value $R_{cv}$ to perform a minimization calculation according to the converted first output value so as to generate and output an R value (that is, the check-to-variable message). Then, the second barrel shifter 135 is used to convert the R value from the check node domain to the variable node domain to generate a converted R value.

Then, during the iterative decoding operation performed for the second time, the variable node unit 120 generates and updates the first output value according to the following equation:

$$\text{qval\_out}_i = \text{abs}(\text{ch\_v}) + \sum R - R_i$$

wherein $\text{qval\_out}_i$ is the first output value generated and updated by the iterative decoding operation performed for the second time. abs(ch_v) is an absolute value of the channel value ch_v. In practice, during the iterative decoding operation performed for the second time, the variable node unit 120 only needs to read multiple magnitude bits of the channel value ch_v from the channel value memory 105 to calculate the absolute value, without reading the sign bit of the channel value ch_v. ΣR is a sum of converted R values of multiple adjacent bits previously generated by the variable node unit 120. $R_i$ is the converted R value generated by the second barrel shifter 135 in a previous iterative decoding operation. In addition, in the iterative decoding operation performed for the second time, the first output value generated by the variable node unit 120 has changed from the channel value ch_v in the iterative decoding operation performed for the first time into the above-mentioned value of $\text{qval\_out}_i$. Therefore, when a change occurs in the value of the first output value, the variable node unit 120 in this situation writes the absolute value (i.e. abs(qval_out;)) of the first output value (i.e. $\text{qval\_out}_i$) into the q sign memory 110 to replace the sign value previously recorded in the q sign memory 110. Similarly, the operations and functions of the first barrel shifter 130, the second barrel shifter 135, and the check node unit 125 in the iterative decoding operation performed for the second time are identical to or similar to those in the iterative decoding operation performed for the first time, and are not described for brevity.

Then, in the iterative decoding operation performed for the third time (or the subsequent n-th iterative decoding operation), the operation of the variable node unit 120 is similar to its operation in the iterative decoding operation performed for the second time, and the variable node unit 120 also calculates and updates the first output value $\text{qval\_out}_i=\text{abs}(\text{ch\_v})+\Sigma R-R_i$. in this situation, the variable node unit 120 can read out the previous sign value stored in the previous iterative decoding operation from the q sign memory 110, and can compare the previous sign value with the current sign value of the first output value. The variable node unit 120 writes the current sign value of the first output value into the q sign memory 110 to replace the sign value originally recorded in the q sign memory 110 only when the previous sign value is different from the current sign value of the first output value.

Furthermore, for generating and updating the second output value, initially during the iterative decoding operation performed for the first time, the variable node unit 120 reads a channel value ch_v from the channel value memory 105. In this situation, the variable node unit 120 reads out a sign bit and multiple magnitude bits, corresponding to the channel value ch_v, from the channel value memory 105. Then, the variable node unit 120 uses the channel value ch_v as the second output value, and at this time the second output value (that is, the channel value ch_v) will not be written into the gradient descent bit memory 115 by the variable node unit 120. Then, during the iterative decoding operation performed for the second time, the variable node unit 120 generates and updates the second output value according to the following equation:

$$\text{app\_out} = \text{abs}(\text{ch\_v}) + \sum R;$$

wherein app_out is the second output value generated and updated by the iterative decoding operation performed for the second time. abs(ch_v) is an absolute value of the channel value ch_v. ΣR is a sum of the converted R values of multiple adjacent bits previously generated. In the iterative decoding operation performed the second time, the second output value generated by the variable node unit 120 has changed from the information, which is not recorded and stored in the iterative decoding operation performed the first time, into the value of above-mentioned app_out. Thus, when a change occurs in the second output value, the variable node unit 120 in this situation writes the absolute value (i.e. abs(app_out)) of the second output value (i.e. app_out) into the gradient descent bit memory 115 to replace the sign value previously recorded in the gradient descent bit memory 115. Then, in the iterative decoding operation performed for the third time (or the subsequent n-th iterative decoding operation), the operation of the variable node unit 120 is similar to its operation in the iterative decoding operation performed for the second time, and the variable node unit 120 also calculates and updates the second output value app_out=abs(ch_v)+ΣR. In this situation, the variable node unit 120 can read out a previous sign value stored by a previous iterative decoding operation from the gradient descent bit memory 115, and can compare the previous sign value with a current sign value of the second output value. The variable node unit 120 writes the current sign value of the second output value into the gradient descent bit memory 115 to replace the sign value originally recorded in the gradient descent bit memory 115 only when the previous sign value is different from the current sign value of the second output value.

The sign value stored in the gradient descent bit memory 115 is equivalent to the noise information when making decisions, i.e. the difference information, and can also be regarded as the gradient descent bit. Therefore, for making a hard decision, the decision bit output unit 140 uses a channel value stored in the channel memory with a corresponding sign value (i.e. difference information) stored in the gradient descent bit memory to perform an exclusive-OR operation upon the two values so as to remove the difference information to obtain the correct bit information as the output data/information generated by the hard decision.

In summary, for the conventional technology that uses a memory to store decision-making information of codewords, if there are 30,000 bits, then the memory needs to use at least half of the 30, 000 bits (e.g. at least more than 10, 000 bit) to record/store bit data/information ‘1’. However, in the embodiments of the present invention, if there are 30, 000 bits, then a memory needs to use only a few hundred bits to record/store the bit data ‘1’ under the same condition. This can greatly reduce the power consumption. Also, the embodiments of the present invention can reduce the number of times for reading a sign bit stored in the channel value memory 105. There is no need to write data into the memory during the iterative decoding operation performed for the first time. It is required to write data into the memory only when the data/value is changed. Thus, this can greatly reduce the power consumption.

Figure 2:
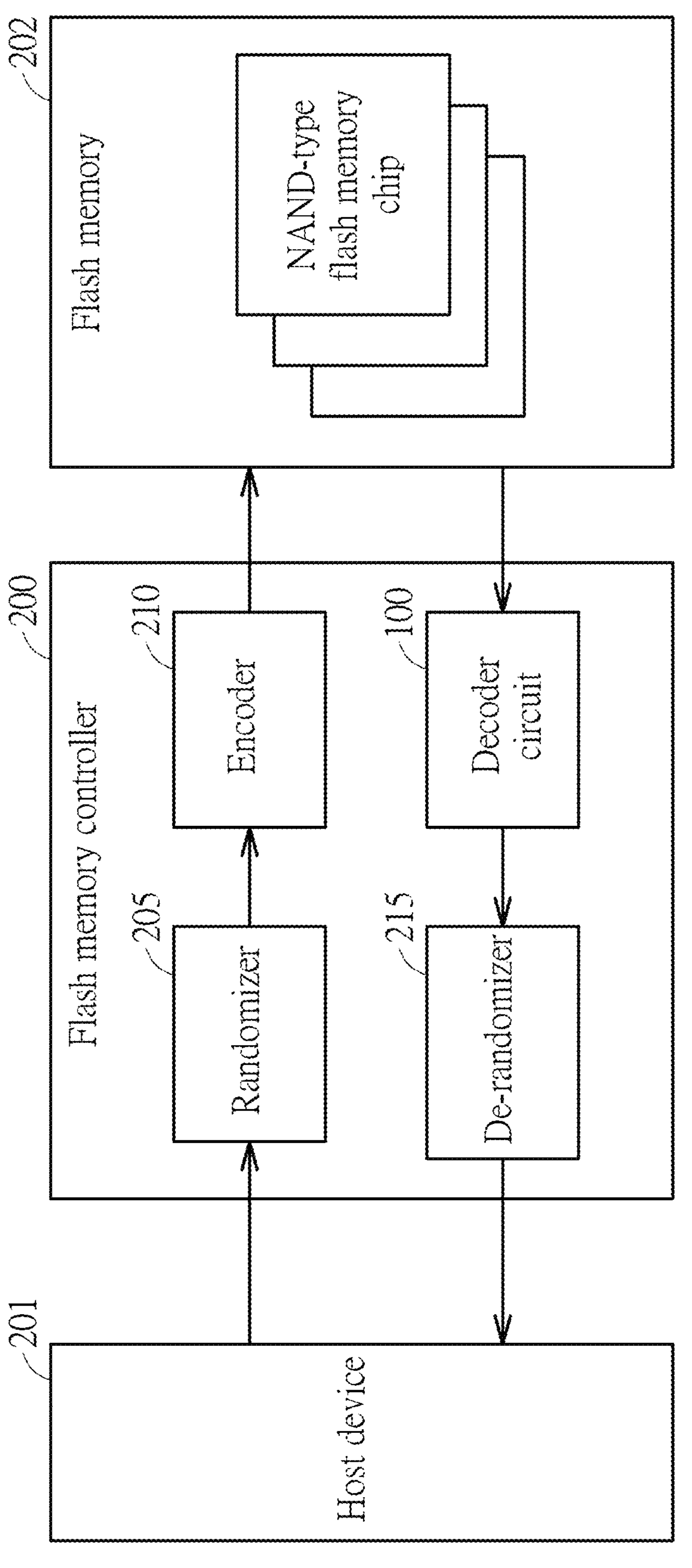
FIG. 2 is a schematic diagram of a flash memory controller including the decoder circuit as shown in FIG. 1 according to an embodiment of the present invention.

FIG. 2 is a schematic diagram of a flash memory controller 200 including the decoder circuit 100 as shown in FIG. 1 according to an embodiment of the present invention. As shown in FIG. 2, the flash memory controller 200 is coupled between a host device 200 and a flash memory 202. The flash memory controller 200 includes a randomizer 205, a de-randomizer 215, an encoder 210, and the decoder circuit 100 as shown in FIG. 1. The flash memory 202 includes multiple flash memory chips such as NAND-type flash memory chip. For example, when the host device 201 writes a data unit to one or more flash memory chips in the flash memory 202, the data to be written (for example simply called a write data) will first be sent to the flash memory controller 200. The randomizer 205 performs a randomization operation upon the write data to generate a randomized write data to eliminate the data skew of the write data to reduce the occurrence of bit errors. Then the encoder 210 performs an encoding processing operation (e.g. low-level parity-check (LDPC) code, but not limited) encoding operation upon the randomized write data to generate an encoded write data to write the encoded write data into one or more flash memory chips of flash memory 202. In addition, when the host device 201 reads a data unit from one or more flash memory chips in the flash memory 202, the data to be read (for example simply called a read data) will first be sent to the flash memory controller 200. The decoder circuit 100 performs a decoding processing operation (e.g. LDPC decoding operation, but not limited) upon the read data based on the novel iterative decoding operations described in the embodiments of FIG. 1 to generate a decoded read data to significantly reduce the power consumption of the flash memory control 200 and then transmit the decoded read data into the de-randomizer 215. Then the de-randomizer 215 performs a de-randomization operation upon the decoded read data to generate a de-randomized read data to transmit the de-randomized read data to the host device 201. The randomizer 205 and the de-randomizer 215 operate in pairs. In another embodiment the flash memory controller 200 may exclude the randomizer 205 and the de-randomizer 215; this example is also applicable in the present invention.

Figure 3:
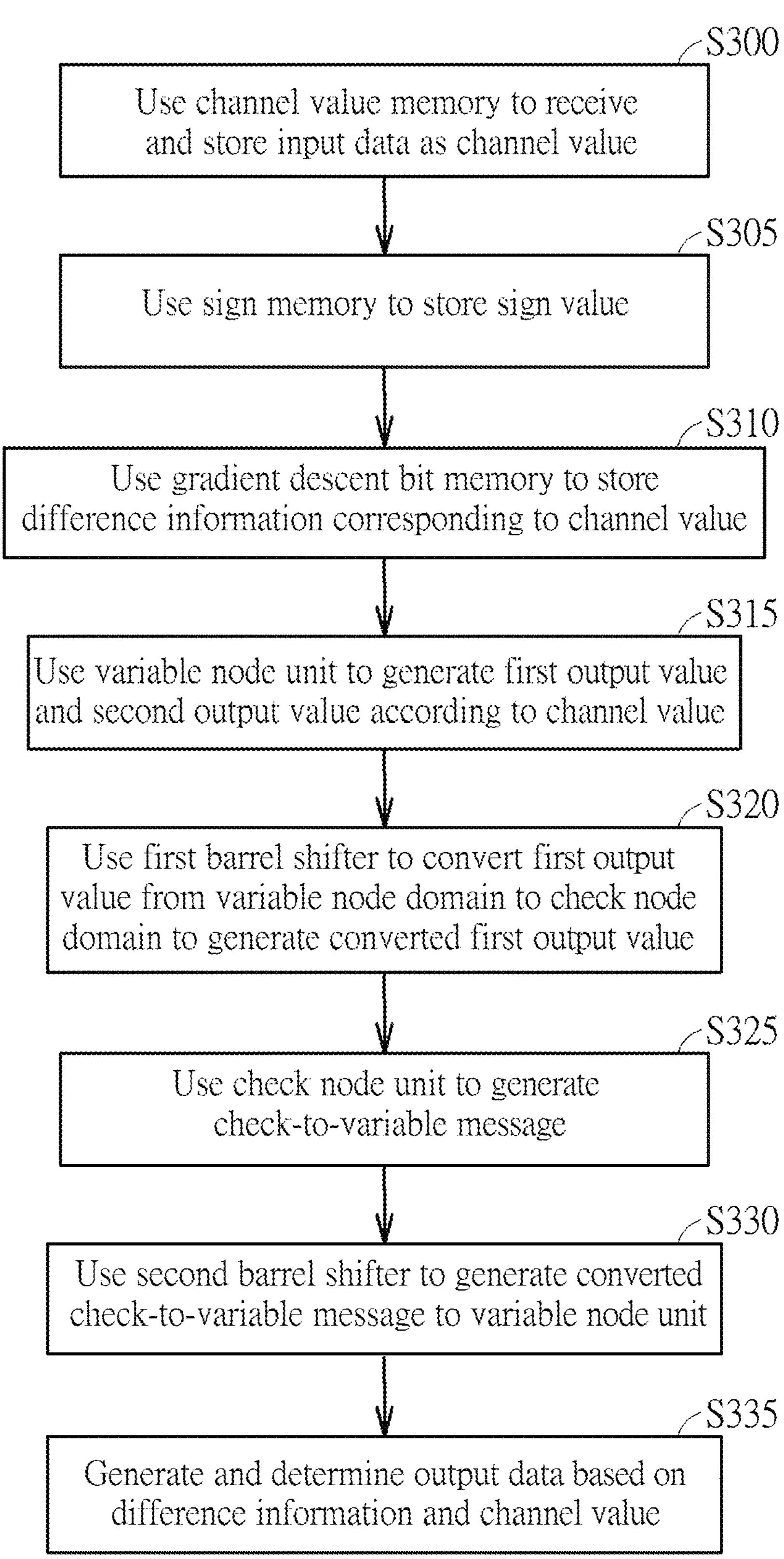
FIG. 3 is a schematic diagram of operation flow of a decoding method of a decoder circuit according to an embodiment of the present invention.

In order to make readers more clearly understand the spirits of the present invention, FIG. 3 is provided. FIG. 3 is a schematic diagram of operation flow of a decoding method of a decoder circuit according to an embodiment of the present invention. The steps are described below:

Step S300: Provide and use a channel value memory to receive and store an input data as a channel value; the channel value is stored in the channel value memory in the form of a sign bit and multiple magnitude bits;

Step S305: provide and use a sign memory to store a sign value;

Step S310: provide and use a gradient descent bit memory to store difference information corresponding to the channel value;

Step S315: provide and use a variable node unit to generate a first output value and a second output value according to the channel value;

Step S320: provide and use a first barrel shifter to convert the first output value from a variable node domain to a check node domain to generate a converted first output value;

Step S325: provide and use a check node unit to generate a check-to-variable message based on the converted first output value and/or the sign value stored in the sign memory;

Step S330: provide and use a second barrel shifter to convert the check-to-variable message from the check node domain to the variable node domain to generate a converted check-to-variable message to the variable node unit; and Step S335: generate and determine an output data based on the difference information, corresponding to the channel value, stored in the gradient descent bit memory and the channel value stored in the channel value memory.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A decoder circuit, comprising:

a channel value memory, for receiving and storing an input data as a channel value, the channel value being stored in the channel value memory in a form of a sign bit with multiple magnitude bits;

a sign memory, for storing a sign value;

a gradient descent bit memory, for storing a difference information corresponding to the channel value;

a variable node unit, coupled to the channel value memory, the sign memory, and the gradient descent bit memory, for generating a first output value and a second output value according to the channel value;

a first barrel shifter, coupled to the variable node unit, for converting the first output value from a variable node domain to a check node domain to generate a converted first output value;

a check node unit, coupled to the first barrel shifter, for generating a check-to-variable message based on the converted first output value or the sign value stored in the sign memory;

a second barrel shifter, coupled to the check node unit, for converting the check-to-variable message from the check node domain to the variable node domain to generate a converted check-to-variable message to the variable node unit; and a decision bit output unit, coupled to the gradient descent bit memory and the channel value memory, for generating and determining an output data according to the channel value in the channel value memory and the difference information corresponding to the channel value stored in the gradient descent bit memory.

2. The decoder circuit of claim 1, wherein when performing an iterative decoding operation for a first time: the variable node unit reads the sign bit and the multiple value bits, corresponding to the channel value, from the channel value memory, and uses the channel value as the first output value; the first barrel shifter converts the first output value from the variable node domain to the check node domain to generate the converted first output value; the check node unit performs a minimization calculation according to the converted first output value to generate and output the check-to-variable message without reading the sign memory; and, the second barrel shifter converts the check-to-variable message from the check node domain to the variable node domain to generate the converted check-to-variable message.

3. The decoder circuit of claim 2, wherein when the iterative decoding operation is performed for a second time, the variable node unit generates and updates the first output value according to a following equation:

$$\text{qval\_out}_i = \text{abs}(\text{ch\_v}) + \sum R - R_i;$$

wherein $\text{qval\_out}_i$ is the first output value generated and updated by the iterative decoding operation performed for the second time; abs(ch_v) is an absolute values of the channel value ch_v, and the variable node during the iterative decoding operation performed for the second time merely reads the multiple magnitude bits from the channel value memory to calculate the absolute value, without reading the sign bit of the channel value; ΣR is a sum of multiple converted check-to-variable messages of multiple adjacent bits previously generated by the variable node unit; $R_i$ is a converted check-to-variable message generated by the second barrel shifter during a previous iterative decoding operation; and, the variable node unit writes and stores an absolute value of the first output value into the sign memory when performing the iterative decoding operation for the second time.

4. The decoder circuit of claim 3, wherein when performing the iterative decoding operation for more than a third time, the variable node unit reads a previous sign value from the sign memory stored by a previous iterative decoding operation, compares the previous sign value with a current sign value of the first output value; and, only when the previous sign value is different from the current sign value of the first output value, the variable node unit writes the current sign value of the first output value to the sign memory to replace the previous sign value.

5. The decoder circuit of claim 1, wherein when performing an iterative decoding operation for a first time, the variable node unit reads the sign bit and the magnitude bits, corresponding to the channel value, from the channel value memory, and uses the channel value as the second output value, wherein the second output value is not written into the gradient descent bit memory by the variable node unit.

6. The decoder circuit of claim 5, wherein when the second iterative decoding operation is performed for a second time, the variable node unit generates and updates the second output value according to a following equation:

$$\text{app\_out} = \text{abs}(\text{ch\_v}) + \sum R;$$

wherein app_out is the second output value generated and updated by the iterative decoding operation performed for the second time; abs(ch_v) is an absolute value of the channel value; ΣR is a sum of multiple converted check-to-variable messages of multiple adjacent bits previously generated by the variable node unit; the variable node unit writes an absolute value of the updated second output value into the gradient descent bit memory as the difference information corresponding to the channel value during the iterative decoding operation performed for the second time.

7. The decoder circuit of claim 6, wherein when performing the iterative decoding operation for more than a third time, the variable node unit generates and updates the second output value based on an equation of app_out=abs (ch_v)+ΣR; the variable node unit reads a previous sign value, which is stored in the gradient descent bit memory by the iterative decoding operation performed previously, from the gradient descent bit memory, and compares the previous sign value in the gradient descent bit memory with a current sign value of the second output value; and, only when the previous sign value in the gradient descent bit memory is different from the current sign value of the second output value, the variable node unit writes the current sign value of the second output value into the gradient descent bit memory and updates the difference information corresponding to the channel value.

8. The decoder circuit of claim 1, wherein the decision bit output unit performs an exclusive-OR operation upon the channel value of the channel value memory and the difference information to perform a hard decision to generate and determine the output data.

9. The decoder circuit of claim 1, being used and included in a flash memory controller.

10. A decoding method of a decoder circuit, comprising:
providing a channel value memory to receive and store an input data as a channel value, the channel value being stored in the channel value memory in a form of a sign bit with multiple magnitude bits;
providing a sign memory to store a sign value;
providing a gradient descent bit memory to store a difference information corresponding to the channel value;
providing a variable node unit to generate a first output value and a second output value according to the channel value;
providing a first barrel shifter to convert the first output value from a variable node domain to a check node domain to generate a converted first output value;
providing a check node unit to generate a check-to-variable message based on the converted first output value or the sign value stored in the sign memory;
providing a second barrel shifter to convert the check-to-variable message from the check node domain to the variable node domain to generate a converted check-to-variable message to the variable node unit; and
generating and determining an output data according to the channel value in the channel value memory and the difference information corresponding to the channel value stored in the gradient descent bit memory.

11. The decoding method of claim 10, further comprising:
when performing an iterative decoding operation for a first time:
using the variable node unit to read the sign bit and the multiple value bits, corresponding to the channel value, from the channel value memory, and using the channel value as the first output value;
using the first barrel shifter to convert the first output value from the variable node domain to the check node domain to generate the converted first output value;
using the check node unit to perform a minimization calculation according to the converted first output value to generate and output the check-to-variable message without reading the sign memory; and
using the second barrel shifter to convert the check-to-variable message from the check node domain to the variable node domain to generate the converted check-to-variable message.

12. The decoding method of claim 11, further comprising:
when the iterative decoding operation is performed for a second time, using the variable node unit to generate and update the first output value according to a following equation:

$$\text{qval\_out}_i = \text{abs}(\text{ch\_v}) + \sum R - R_i;$$

wherein $\text{qval\_out}_i$ is the first output value generated and updated by the iterative decoding operation performed for the second time; abs(ch_v) is an absolute values of the channel value ch_v, and the variable node during the iterative decoding operation performed for the second time merely reads the multiple magnitude bits from the channel value memory to calculate the absolute value, without reading the sign bit of the channel value; ΣR is a sum of multiple converted check-to-variable messages of multiple adjacent bits previously generated by the variable node unit; $R_i$ is a converted check-to-variable message generated by the second barrel shifter during a previous iterative decoding operation; and, the variable node unit writes and stores an absolute value of the first output value into the sign memory when performing the iterative decoding operation for the second time.

13. The decoding method of claim 12, further comprising:
when performing the iterative decoding operation for more than a third time:
using the variable node unit to read a previous sign value from the sign memory stored by a previous iterative decoding operation, and comparing the previous sign value with a current sign value of the first output value; and
only when the previous sign value is different from the current sign value of the first output value, using the variable node unit to write the current sign value of the first output value to the sign memory to replace the previous sign value.

14. The decoding method of claim 10, further comprising:
wherein when performing an iterative decoding operation for a first time, using the variable node unit to read the sign bit and the magnitude bits, corresponding to the channel value, from the channel value memory, and to use the channel value as the second output value, wherein the second output value is not written into the gradient descent bit memory by the variable node unit.

15. The decoding method of claim 14, further comprising:
when the second iterative decoding operation is performed for a second time, using the variable node unit to generate and update the second output value according to a following equation:

$$\text{app\_out} = \text{abs}(\text{ch\_v}) + \sum R;$$

wherein app_out is the second output value generated and updated by the iterative decoding operation performed for the second time; abs(ch_v) is an absolute value of the channel value; ΣR is a sum of multiple converted check-to-variable messages of multiple adjacent bits previously generated by the variable node unit; the variable node unit writes an absolute value of the updated second output value into the gradient descent bit memory as the difference information corresponding to the channel value during the iterative decoding operation performed for the second time.

16. The decoding method of claim 15, further comprising:
when performing the iterative decoding operation for more than a third time:
using the variable node unit to generate and update the second output value based on an equation of app_out=abs(ch_v)+ΣR;
using the variable node unit to read a previous sign value, which is stored in the gradient descent bit memory by the iterative decoding operation performed previously, from the gradient descent bit memory, and comparing the previous sign value in the gradient descent bit memory with a current sign value of the second output value; and
only when the previous sign value in the gradient descent bit memory is different from the current sign value of the second output value, using the variable node unit to write the current sign value of the second output value into the gradient descent bit memory and update the difference information corresponding to the channel value.

17. The decoding method of claim 10, further comprising: using the decision bit output unit to perform an exclusive-OR operation upon the channel value of the channel value memory and the difference information to perform a hard decision to generate and determine the output data.

* * * * *